United States Patent
Fan

(10) Patent No.: US 7,683,566 B2
(45) Date of Patent: Mar. 23, 2010

(54) FAN ROTATION SPEED CONTROL CIRCUIT OF POWER SUPPLY SYSTEM

(75) Inventor: Cheng-Shun Fan, Taipei (TW)

(73) Assignee: Inventec Corporation, Taipei (TW)

( * ) Notice: Subject to any disclaimer, the term of this patent is extended or adjusted under 35 U.S.C. 154(b) by 552 days.

(21) Appl. No.: 11/699,546

(22) Filed: Jan. 30, 2007

(65) Prior Publication Data

US 2008/0181586 A1 Jul. 31, 2008

(51) Int. Cl.
*G05B 11/28* (2006.01)

(52) U.S. Cl. .................. 318/599; 318/268; 318/280; 318/400.01; 318/779; 318/811; 388/800; 388/804

(58) Field of Classification Search ............... 318/119, 318/130, 400.01, 400.05, 268, 280, 779, 318/599, 400.06, 811, 430, 432; 361/695, 361/679.47, 679.48; 165/244; 310/40.5; 388/800, 811, 823, 915, 804

See application file for complete search history.

(56) References Cited

U.S. PATENT DOCUMENTS

| | | | | |
|---|---|---|---|---|
| 5,463,874 A | * | 11/1995 | Farr | 62/126 |
| 5,606,296 A | * | 2/1997 | Seong | 332/109 |
| 5,825,972 A | * | 10/1998 | Brown | 388/811 |
| 5,952,798 A | * | 9/1999 | Jones et al. | 318/268 |
| 6,008,603 A | * | 12/1999 | Jones et al. | 318/400.32 |
| 6,040,668 A | * | 3/2000 | Huynh et al. | 318/471 |
| 6,135,718 A | * | 10/2000 | Yang | 417/22 |
| 6,252,209 B1 | * | 6/2001 | Liepold | 219/501 |
| 6,346,852 B1 | * | 2/2002 | Masini et al. | 330/10 |
| 6,392,372 B1 | * | 5/2002 | Mays, II | 318/400.01 |
| 6,545,438 B1 | * | 4/2003 | Mays, II | 318/400.01 |
| 6,812,667 B2 | * | 11/2004 | Yasohara et al. | 318/599 |
| 7,138,781 B2 | * | 11/2006 | Murray et al. | 318/400.04 |
| 7,205,733 B2 | * | 4/2007 | Xiong et al. | 318/400.11 |
| 7,279,947 B2 | * | 10/2007 | Chiu et al. | 327/172 |
| 2003/0126866 A1 | * | 7/2003 | Spry | 62/3.7 |

FOREIGN PATENT DOCUMENTS

TW M290192 5/2006

\* cited by examiner

*Primary Examiner*—Walter Benson
*Assistant Examiner*—Antony M Paul
(74) *Attorney, Agent, or Firm*—Rabin & Berdo, P.C.

(57) ABSTRACT

A fan rotation speed control circuit of a power supply system is provided, which is applicable for controlling the rotation speed of the fan according to a loading state outputted by the power supply system. The fan rotation speed control circuit of the power supply system includes a waveform generating module, for generating an oscillating waveform signal; a current retrieving module, for retrieving a current signal corresponding to the loading state; a rotation speed control signal generating module, for comparing the oscillating waveform signal with the current signal, and generating a rotation speed control signal; a signal amplifying module, for amplifying an amplitude of the rotation speed control signal and outputting the amplified rotation speed control signal to the fan, so as to control the rotation speed of the fan.

3 Claims, 4 Drawing Sheets

FAN ROTATION SPEED CONTROL CIRCUIT OF POWER SUPPLY SYSTEM

BACKGROUND OF THE INVENTION

1. Field of Invention

The present invention relates to a fan rotation speed control circuit, and more particularly to a fan rotation speed control circuit, applicable for controlling the rotation speed of the fan according to a loading state of a power supply system.

2. Related Art

The current power supply standard of the server can be classified into two types, namely, ATX power supply and SSI power supply, in which the ATX power supply standard is mainly applied to desktop computers, work stations, and low-level servers; the SSI power supply standard is mainly applied to servers in various levels.

As the increasing of the processing speed of the computer, the required power also increases, and thus, the power supply system requires a better heat dissipation device for dissipating heats, so as to operate normally in a safe temperature range. A commonly used heat dissipation device is a fan, which is controlled to operate correspondingly through sensing the temperature change of the power supply system. However, the process for sensing a temperature has a defect, that is, after the power supply system has operated for a period of time, the temperature of the system rises or drops along with the changing of the loading state, and at this time, a temperature sensing circuit senses the change of the temperature, thereby outputting a signal to a fan rotation speed control circuit to control the fan rotation speed to be adjusted correspondingly. In other words, due to the time required for sensing the temperature, this fan rotation speed controlling process generates delay in controlling the fan rotation speed, instead of controlling the fan rotation speed in real time according to the loading state, and thus it still needs to be improved.

With reference to Taiwan Patent No. M290192, a fan control circuit is disclosed, which includes a heat conductive circuit and a feedback control circuit. The feedback control circuit includes a driving portion for supplying a current to the fan, the heat conductive circuit converts the change of the ambient temperature into electric signals, and the feedback control circuit generates a control signal through calculation. The control signal controls the driving current supplied to the fan by the driving portion, thereby controlling the rotation speed of the fan.

Although the above patent can control the rotation speed of the fan according to the temperature in the computer case, to ensure the temperature in the computer case be kept within an allowable range, thereby saving the power consumption of the system, and reducing the noises in the computer case. However, similar to the fan rotation speed control circuit in the temperature sensing mode, it still has the delay problem in the control of the fan rotation speed.

Therefore, in the fan rotation speed control circuit of the current power supply system, the method of controlling the fan rotation speed by means of sensing the temperature has the problem of time delay, which cannot control the fan rotation speed in real time according to the loading state. Moreover, the specification and type of the power supply provided by the power supply system cannot satisfy the requirements of other circuits.

SUMMARY OF THE INVENTION

In view of the above problems, the present invention is directed to a fan rotation speed control circuit of a power supply system, which directly retrieves a current signal corresponding to a loading state, and generates a fan rotation speed control signal according to the current signal, so as to control the rotation speed of the fan, thereby controlling the fan of the power supply system in real time, and achieving the purpose of accurate controlling.

The fan rotation speed control circuit of the power supply system according to the present invention comprises a waveform generating module, a voltage buffer module, a current retrieving module, a rotation speed control signal generating module, a signal amplifying module, and a fan.

First, the waveform generating module generates an oscillating waveform signal (e.g., a saw-tooth wave signal) to the voltage buffer module, and the voltage buffer module buffers and outputs the oscillating waveform signal to the rotation speed control signal generating module. Meanwhile, the current retrieving module retrieves the current signal corresponding to the loading state, and outputs the current signal to the rotation speed control signal generating module. Next, the rotation speed control signal generating module compares the oscillating waveform signal with the current signal, and generates a rotation speed control signal. Finally, the signal amplifying module receives the rotation speed control signal outputted by the rotation speed control signal generating module, and amplifies an amplitude of the rotation speed control signal, and outputs the amplified rotation speed control signal to a fan, so as to control the rotation speed of the fan.

With the fan rotation speed control circuit of the power supply system, an operation current of the load is obtained by way of directly detecting, and according to the operation current of the load, the rotation speed control signal is generated to the fan, such that the fan adjusts its rotation speed along with the loading state. Therefore, the present invention not only has the advantage of low cost, without requiring an additional temperature sensing circuit, but in terms of the control of the rotation speed, the problem of the control delay of the temperature sensing method is also eliminated.

The features and practice of the preferred embodiments of the present invention will be illustrated in detail below with reference to the accompanying drawings.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, which thus is not limitative of the present invention, and wherein.

DETAILED DESCRIPTION OF THE INVENTION

Figure 1:
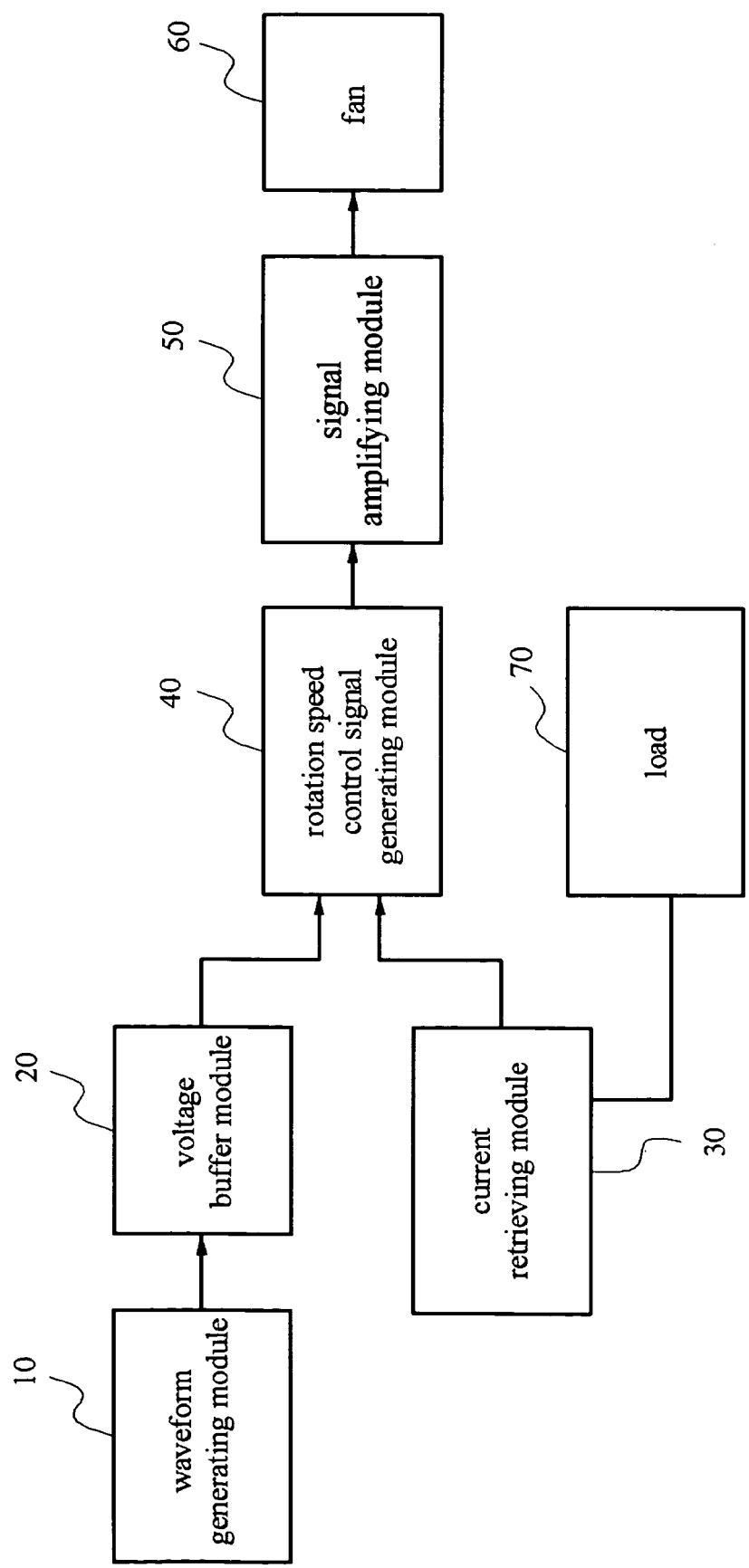
FIG. 1 is a block diagram of a system according to an embodiment of the present invention.

Referring to FIG. 1, it is a block diagram of a system according to an embodiment of the present invention. As shown in FIG. 1, a fan rotation speed control circuit of a power supply system according to the embodiment of the present invention includes a waveform generating module 10, a voltage buffer module 20, a current retrieving module 30, a rotation speed control signal generating module 40, a signal amplifying module 50, and a fan 60, and each module is respectively illustrated herein below.

The waveform generating module 10 is used to generate an oscillating waveform signal, in which the oscillating waveform signal can be, for example, a triangular wave signal or a saw-tooth wave signal, and the oscillating waveform signal according to the embodiment of the present invention is preferably the saw-tooth wave signal.

The voltage buffer module 20 is electrically coupled to the waveform generating module 10, for receiving and buffering the oscillating waveform signal inputted from the waveform generating module 10, so as to isolate the oscillating waveform signal from the rotation speed control signal generating module 40, thereby preventing a load effect of the rotation speed control signal generating module 40 from influencing the output of the waveform generating module 10. Then, the voltage buffer module 20 outputs the oscillating waveform signal to the rotation speed control signal generating module 40, in which the voltage buffer module 20 can be, for example, a voltage follower composed of operational amplifiers.

The current retrieving module 30 is electrically connected to a load 70, for retrieving a current signal corresponding to a loading state. The process for retrieving the current signal can be, for example, a resistance converting technique, that is, a resistor with a low resistance is serially connected on a power supply path, and when a current flows through the resistor, a slight voltage drop is generated, and thus, the current consumed by the load 70 at this time can be calculated. Alternatively, signals in a current sharing bus of the power supply system are directly read through a hardware detection circuit, and the current sharing bus is used to provide signals to a power supply under a redundant power supply mode of the power supply system, such that the power supply supplies a uniform current to the load 70.

The rotation speed control signal generating module 40 is electrically coupled to the voltage buffer module 20 and the current retrieving module 30, for comparing the oscillating waveform signal with the current signal, and generating a rotation speed control signal according to the comparison result. The rotation speed control signal is a pulse width modulation (PWM) signal, and the rotation speed control signal generating module 40 can be, for example, a comparison operational amplifier circuit.

The signal amplifying module 50 is electrically coupled to the rotation speed control signal generating module 40, for amplifying an amplitude of the rotation speed control signal, such that the rotation speed control signal meets the voltage specification requirement for driving the fan to operate, and outputting the amplified rotation speed control signal to the fan 60, so as to control the rotation speed of the fan 60. The signal amplifying module 50 can be, for example, a push-pull amplifier circuit formed by a NPN transistor and a PNP transistor.

The fan 60 is electrically coupled to the signal amplifying module 50, for receiving the rotation speed control signal outputted by the signal amplifying module 50, so as to operate correspondingly.

The operation principle of the circuit is illustrated herein below.

First, the waveform generating module 10 generates an oscillating waveform signal (e.g., a triangular wave signal) to the voltage buffer module 20, and the voltage buffer module 20 buffers and outputs the oscillating waveform signal to the rotation speed control signal generating module 40. Meanwhile, the current retrieving module 30 retrieves a current signal corresponding to the loading state, and outputs the current signal to the rotation speed control signal generating module 40. Then, the rotation speed control signal generating module 40 compares the oscillating waveform signal with the current signal, and generates a rotation speed control signal.

Finally, the signal amplifying module 50 receives the rotation speed control signal outputted by the rotation speed control signal generating module 40, amplifies the amplitude of the rotation speed control signal, and outputs the amplified rotation speed control signal to a fan 60, so as to control the rotation speed of the fan 60.

Figure 2:
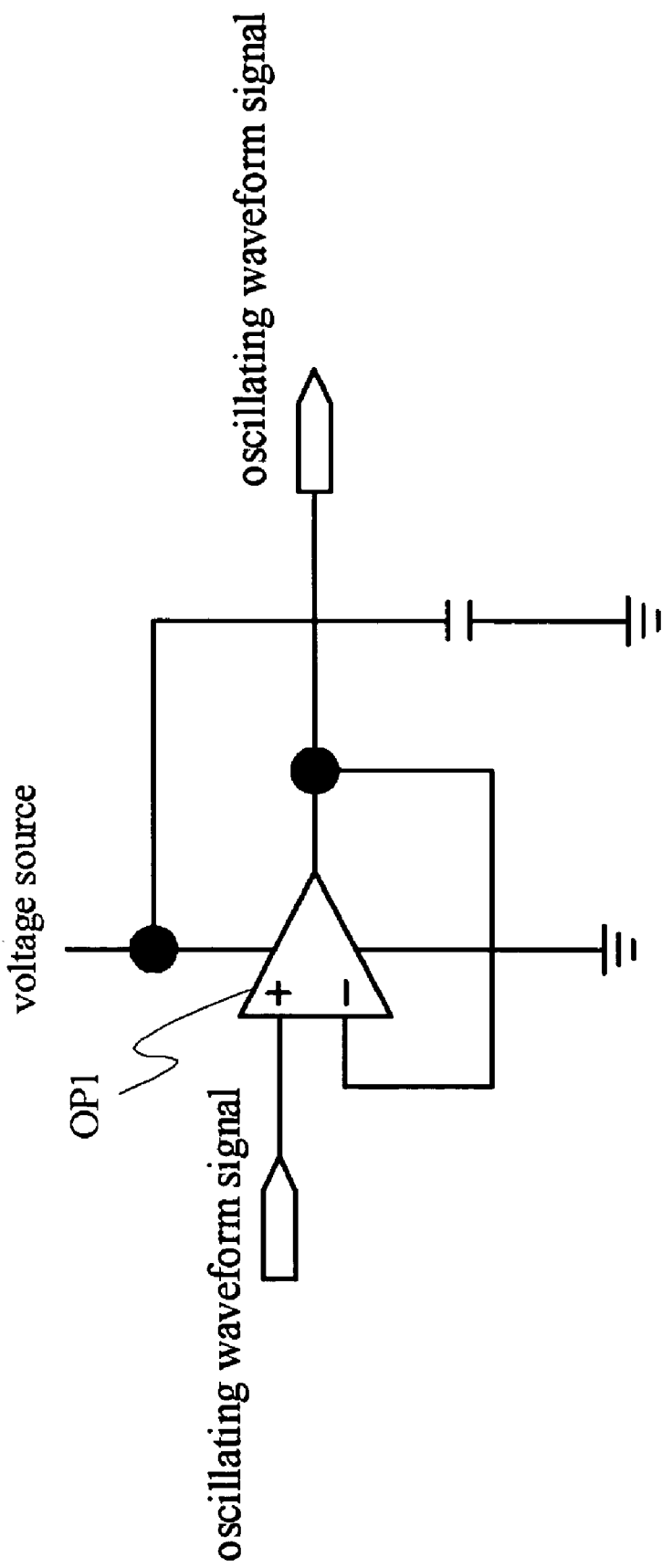
FIG. 2 is a schematic circuit diagram of a voltage buffer module according to the embodiment of the present invention.

Referring to FIG. 2, it is a schematic circuit diagram of a voltage buffer module according to the embodiment of the present invention. As shown in FIG. 2, the voltage buffer module 20 according to the embodiment of the present invention includes a first operational amplifier OP1, and the first operational amplifier OP1 has a first input terminal (i.e., a non-inverting input terminal), a second input terminal (i.e., an inverting input terminal), and an output terminal. The second input terminal is electrically coupled to the output terminal, so as to form a signal feedback loop. The first operational amplifier OP1 receives the oscillating waveform signal generated by the waveform generating module 10 with the first input terminal, and outputs the oscillating waveform signal by the output terminal. Through utilizing the characteristic of the voltage buffer module 20, it prevents the load effect of the rotation speed control signal generating module 40 from causing the distortion of the oscillating waveform signal.

Figure 3:
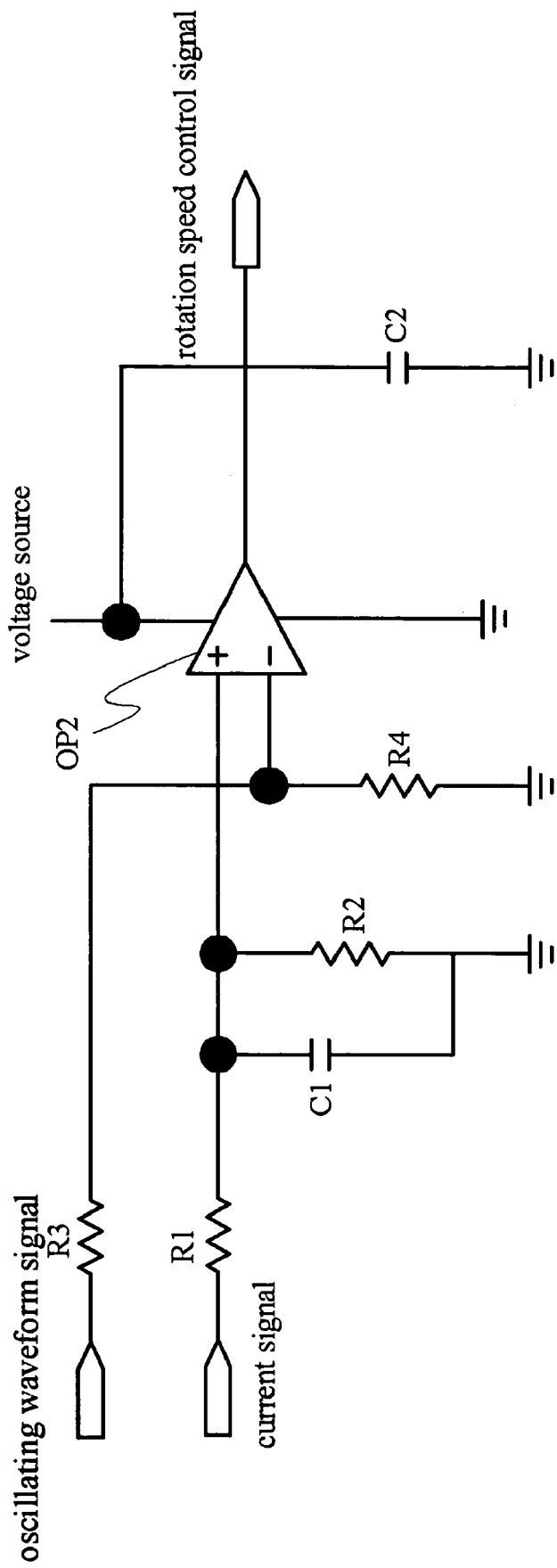
FIG. 3 is a schematic circuit diagram of a rotation speed control signal generating module according to the embodiment of the present invention.

Referring to FIG. 3, it is a schematic circuit diagram of a rotation speed control signal generating module according to the embodiment of the present invention. As shown in FIG. 3, the rotation speed control signal generating module 40 according to the embodiment of the present invention includes a second operational amplifier OP2, a first resistor R1, a second resistor R2, a third resistor R3, a forth resistor R4, and a first capacitor C1, and the connection relationship among the circuit elements is illustrated herein below.

First, the second operational amplifier OP2 has a first input terminal (i.e., the non-inverting input terminal), a second input terminal (i.e., the inverting input terminal), and an output terminal. The first input terminal receives the current signal outputted by the current retrieving module 30, the second input terminal receives the oscillating waveform signal outputted by the voltage buffer module 20, and the output terminal outputs the rotation speed control signal.

The first resistor R1 is electrically coupled between the current retrieving module 30 and the first input terminal, the second resistor R2 is electrically coupled between the first input terminal and a ground terminal, the third resistor R3 is electrically coupled between the voltage buffer module 20 and the second input terminal, the forth resistor R4 is electrically coupled between the second input terminal and the ground terminal, the first capacitor C1 is electrically coupled between the first resistor R1 and the ground terminal. Moreover, a second capacitor C2 is electrically coupled between a voltage source and the ground terminal.

Figure 4:
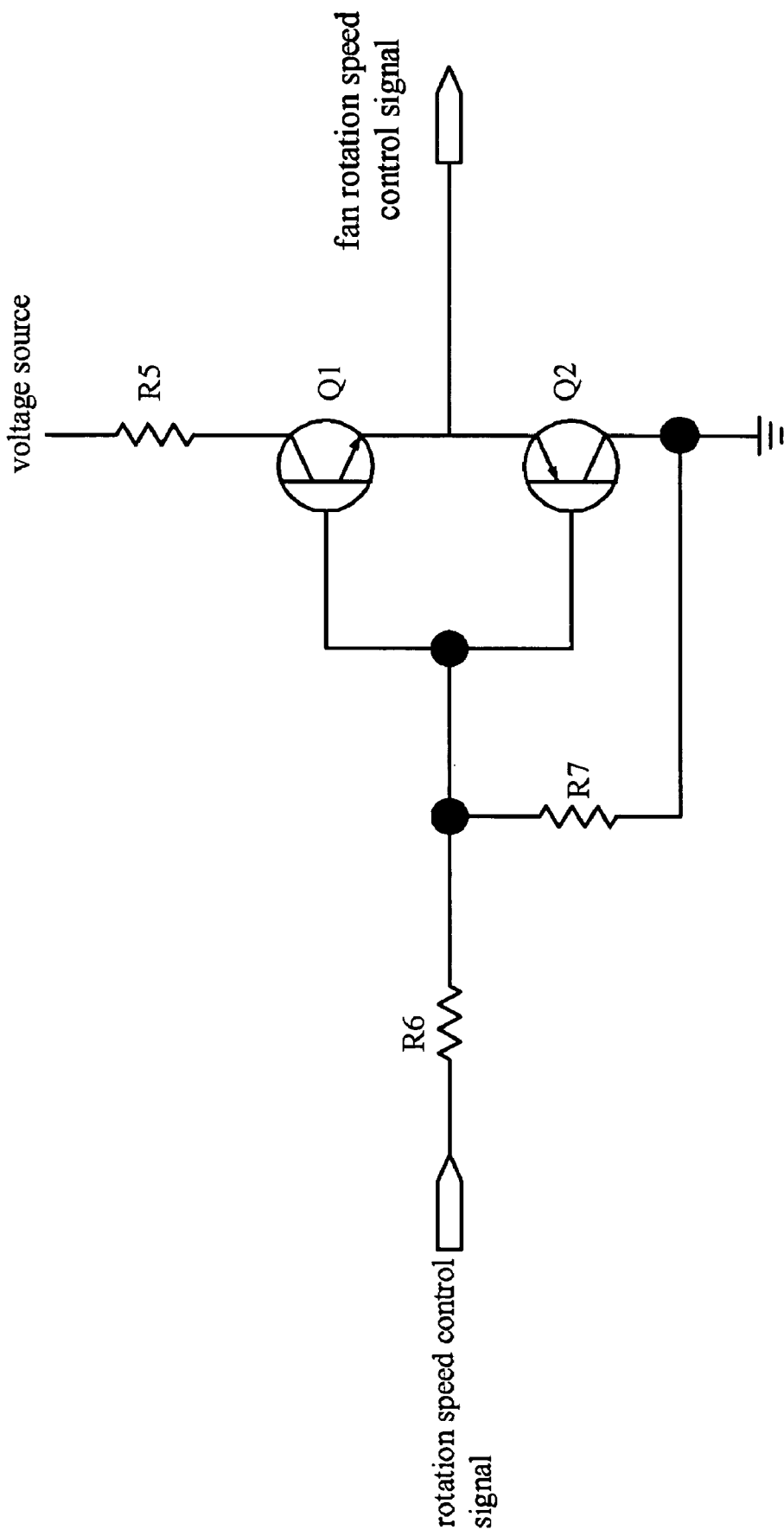
FIG. 4 is a schematic circuit diagram of a signal amplifying module according to the embodiment of the present invention.

Referring to FIG. 4, it is a schematic circuit diagram of a signal amplifying module according to the embodiment of the present invention. As shown in FIG. 4, the signal amplifying module 50 according to the embodiment of the present invention includes a first transistor Q1, a second transistor Q2, a fifth resistor R5, a sixth resistor R6, and a seventh resistor R7, and the connection relationship between the circuit elements is illustrated herein below.

First, the first transistor Q1 is an NPN transistor. A collector of the first transistor Q1 is electrically coupled to a second terminal of the fifth resistor R5, and a first terminal of the fifth resistor R5 is electrically coupled to the voltage source. A base of the first transistor Q1 is electrically coupled to a base of the second transistor Q2, a second terminal of the sixth resistor R6, and a first terminal of the seventh resistor R7. An emitter of the first transistor Q1 is electrically coupled to an emitter of the second transistor Q2; a collector of the second transistor Q2 is electrically coupled to a second terminal of the seventh resistor R7 and the ground terminal. A first terminal of the sixth resistor R6 receives the rotation speed control signal, and through utilizing the characteristic of the signal amplifying module 50, the rotation speed control signal is amplified to meet the voltage specification requirement for driving the fan to operate.

To sum up, the fan rotation speed control circuit of the power supply system according to the present invention not only has the advantage of without requiring an additional cost of disposing the temperature sensing circuit, but also controls the rotation speed of the fan in real time according to the loading state, thereby making the fan be more accurately controlled.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A fan rotation speed control circuit of a power supply system, applicable for controlling a fan rotation speed according to a loading state outputted by the power supply system, comprising:
    a waveform generating module, for generating an oscillating waveform signal, wherein the oscillating waveform signal is a triangular wave signal or a saw-tooth wave signal;
    a voltage buffer module, electrically coupled to the waveform generating module, for buffering the oscillating waveform signal;
    a current retrieving module, for retrieving a current signal corresponding to the loading state;
    a rotation speed control signal generating module, electrically coupled to the waveform generating module and the current retrieving module, for comparing the oscillating waveform signal with the current signal, and generating a pulse width modulation (PWM) signal, wherein the rotation speed control signal generating module comprises:
        an operational amplifier, having a first input terminal, a second input terminal, and an output terminal, wherein the first input terminal receives the current signal, the second input terminal receives the oscillating waveform signal, and the output terminal outputs the PWM signal;
        a first resistor, electrically coupled between the current retrieving module and the first input terminal;
        a second resistor, electrically coupled between the first input terminal and a ground terminal;
        a third resistor, electrically coupled between the voltage buffer module and the second input terminal;
        a forth resistor, electrically coupled between the second input terminal and the ground terminal; and
        a first capacitor, electrically coupled between the first resistor and the ground terminal; and
    a signal amplifying module, electrically coupled to the PWM signal generating module, for amplifying an amplitude of the rotation speed control signal, and outputting the amplified PWM signal to a fan, so as to control the rotation speed of the fan.

2. The fan rotation speed control circuit of the power supply system as claimed in claim 1, wherein the voltage buffer module is a voltage follower.

3. The fan rotation speed control circuit of the power supply system as claimed in claim 1, wherein the signal amplifying module is a push-pull amplifier circuit.

* * * * *